United States Patent [19]

Wu et al.

[11] Patent Number: 5,773,358

[45] Date of Patent: Jun. 30, 1998

[54] METHOD OF FORMING A FIELD EFFECT TRANSISTOR AND METHOD OF FORMING CMOS INTEGRATED CIRCUITRY

[75] Inventors: Jeff Zhiqiang Wu, Meridian; Sittampalam Yoganathan, Boise, both of Id.

[73] Assignee: Micron Technology, Inc., Boise, Id.

[21] Appl. No.: 695,407

[22] Filed: Aug. 12, 1996

Related U.S. Application Data

[62] Division of Ser. No. 440,222, May 12, 1995, Pat. No. 5,571,733.

[51] Int. Cl.⁶ ................................................ H01L 21/265
[52] U.S. Cl. ......................... 438/564; 438/300; 438/301; 438/521; 148/DIG. 141
[58] Field of Search ...................................... 438/300, 521, 438/289, 301, 564; 148/DIG. 141

[56] References Cited

U.S. PATENT DOCUMENTS

| | | | |
|---|---|---|---|
| 4,330,931 | 5/1982 | Liu | 438/301 |
| 4,356,622 | 11/1982 | Widmann | 438/289 |
| 4,494,997 | 1/1985 | Lemnios et al. | 438/521 |
| 4,824,796 | 4/1989 | Chiu et al. | 437/34 |
| 4,945,070 | 7/1990 | Hsu | 437/34 |
| 4,948,745 | 8/1990 | Pfeister et al. | 438/300 |
| 5,112,761 | 5/1992 | Matthews | 437/34 |
| 5,200,352 | 4/1993 | Pfiester | 437/40 SW |
| 5,422,289 | 6/1995 | Pierce | 437/41 SW |

*Primary Examiner*—Charles L. Bowers, Jr.
*Assistant Examiner*—Craig Thompson
*Attorney, Agent, or Firm*—Wells, St. John, Roberts, Gregory & Matkin, P.S.

[57] ABSTRACT

Methods of forming field effect transistors. In one aspect, a method of forming a field effect transistor includes: a) providing a gate structure over a semiconductor substrate, the gate structure comprising a conductively-doped polysilicon region and a dopant masking cap over the conductively-doped polysilicon region; b) providing a layer of polysilicon over the substrate and over the dopant masking cap of the gate structure, the polysilicon layer defining a pair of polysilicon outward projections extending from the semiconductor substrate adjacent the gate structure; c) removing the layer of polysilicon from over the dopant masking cap; d) while the dopant masking cap is over the polysilicon region, conductively doping the pair of polysilicon projections with one of an n-type or a p-type conductivity enhancing dopant impurity; and e) out-diffusing the one of the n-type conductivity enhancing dopant impurity or the p-type conductivity enhancing dopant impurity from the pair of polysilicon projections into the semiconductor substrate to provide one of NMOS or PMOS type diffusion regions, respectively, within the substrate adjacent the gate line.

9 Claims, 10 Drawing Sheets

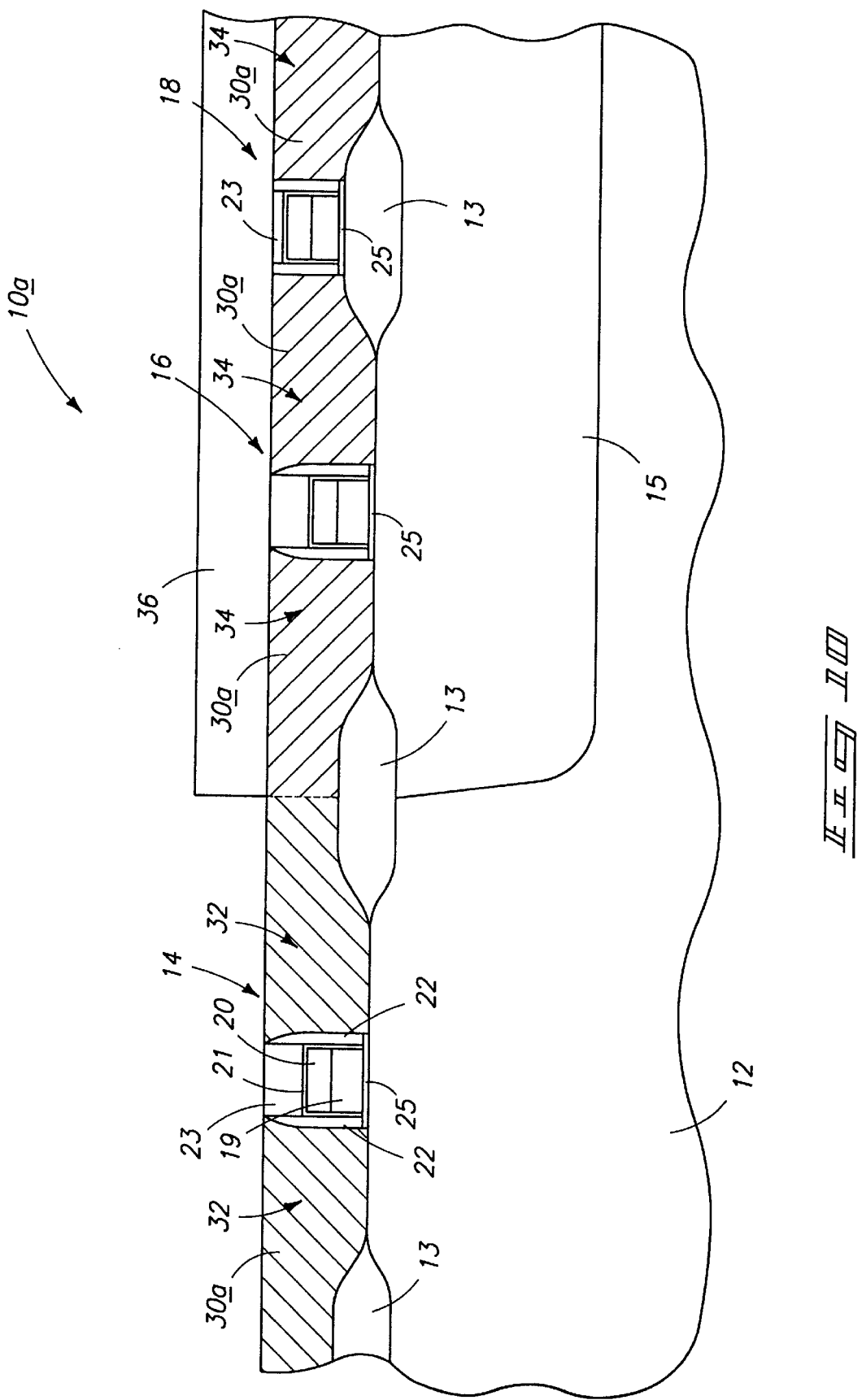

5,773,358

METHOD OF FORMING A FIELD EFFECT TRANSISTOR AND METHOD OF FORMING CMOS INTEGRATED CIRCUITRY

RELATED PATENT DATA

This patent resulted from a divisional application under 37 CFR §1.60(b) of prior application Ser. No. 08/440,222 filed on May 12, 1995, entitled "Method Of Forming A Field Effect Transistor And Method Of Forming CMOS Integrated Circuitry", by the following named inventors: Jeff Zhiqiang Wu, and Sittampalam Yoganathan.

TECHNICAL FIELD

This invention relates to methods of forming complementary metal oxide semiconductor (CMOS) integrated circuitry, and to methods of forming field effect transistors.

BACKGROUND OF THE INVENTION

An MOS (metal-oxide-semiconductor) structure in semiconductor processing is created by superimposing several layers of conducting, insulating and transistor forming materials. After a series of processing steps, a typical structure might comprise levels of diffusion, polysilicon and metal that are separated by insulating layers.

CMOS is so-named because it uses two types of transistors, namely an n-type transistor (NMOS) and a p-type transistor (PMOS). These are fabricated in a semiconductor substrate, typically silicon, by using either negatively doped silicon that is rich in electrons or positively doped silicon that is rich in holes. Different dopant ions are utilized for doping the desired substrate regions with the desired concentration of produced holes or electrons.

NMOS remained the dominant MOS technology as long as the integration level devices on a chip was sufficiently low. It is comparatively inexpensive to fabricate, very functionally dense, and faster than PMOS. With the dawning of large scale integration, however, power consumption in NMOS circuits began to exceed tolerable limits. CMOS represented a lower-power technology capable of exploiting large scale integration fabrication techniques.

CMOS fabrication does however present a number of challenges to the fabricator as compared to using PMOS or NMOS alone. Specifically, typically independent or separate masking steps are utilized for masking one of the p-type regions while the n-type region is being doped. Also, the n-type regions are separately masked when the p-type regions are being doped. Accordingly, typical transistor flows use one mask each to form the n-channel and p-channel transistor source and drain regions. Higher levels of integration result in denser and denser circuits, leading CMOS fabrication to more difficulties.

It would be desirable to develop methods which further facilitate formation of complementary source and drain regions within a semiconductor substrate.

BRIEF DESCRIPTION OF THE DRAWINGS

Preferred embodiments of the invention are described below with reference to the following accompanying drawings.

FIG. 10 is a view of the FIG. 9 wafer at a processing step subsequent to that shown by FIG. 9.

DETAILED DESCRIPTION OF THE PREFERRED EMBODIMENTS

Figure 1:
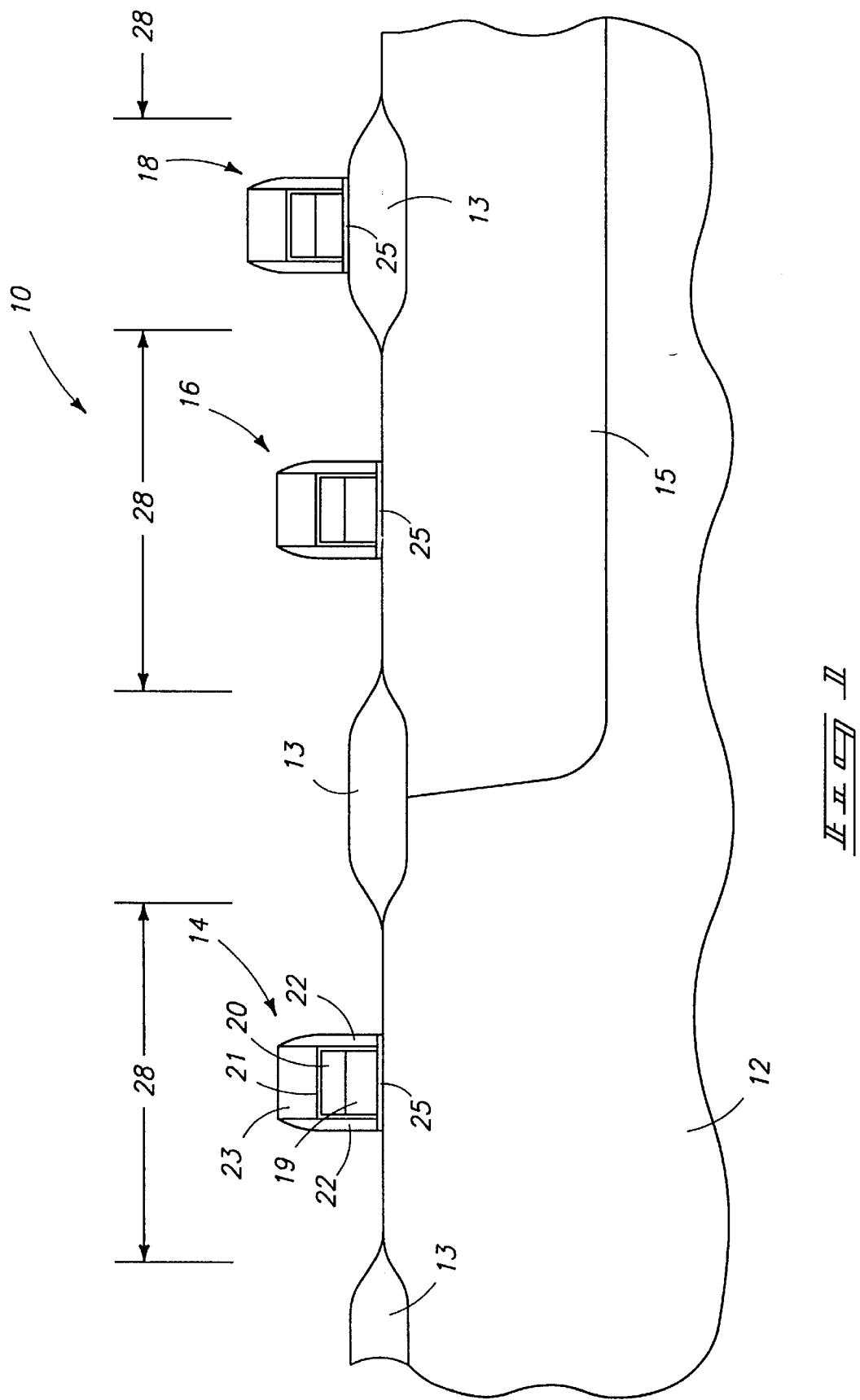
FIG. 1 is a diagrammatic sectional view of a semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

In accordance with one aspect of the invention, a method of forming CMOS integrated circuitry comprises the following steps:

providing a series of field oxide regions and a series of gate lines over a semiconductor substrate, a first gate line being positioned relative to the substrate for formation of an NMOS transistor, a second gate line being positioned relative to the substrate for formation of a PMOS transistor;

providing a layer of polysilicon over the substrate, the polysilicon layer defining a first pair of polysilicon outward projections extending from the semiconductor substrate adjacent the first gate line, the is polysilicon layer defining a second pair of polysilicon outward projections extending from the semiconductor substrate adjacent the second gate line;

masking one of the first or second pair of polysilicon projections while conductively doping the other of the first or second pair with an n-type or a p-type conductivity enhancing dopant impurity, respectively;

masking the other of the first or second pair of polysilicon projections while conductively doping the one of the first or second pair of polysilicon projections with an n-type or a p-type conductivity enhancing dopant impurity, respectively;

out-diffusing n-type conductivity enhancing dopant impurity from the first pair of polysilicon projections into the semiconductor substrate to provide NMOS type diffusion regions within the substrate adjacent the first gate line; and out-diffusing p-type conductivity enhancing dopant impurity from the second pair of polysilicon projections into the semiconductor substrate to provide PMOS type diffusion regions within the substrate adjacent the second gate line.

In accordance with another aspect of the invention, a method of forming CMOS integrated circuitry comprises the following steps:

providing a series of field oxide regions and a series of gate lines over a semiconductor substrate, a first gate line being positioned relative to the substrate for formation of an NMOS transistor, a second gate line being positioned relative to the substrate for formation of a PMOS transistor;

providing a layer of polysilicon over the substrate, the polysilicon layer defining a first pair of polysilicon outward projections extending from the semiconductor substrate adjacent the first gate line, the polysilicon layer defining a second pair of polysilicon outward projections extending from the semiconductor substrate adjacent the second gate line;

blanket doping the first and second pair of polysilicon projections with one of an n-type or a p-type conductivity enhancing dopant impurity, the blanket doping being conducted to a first impurity concentration;

masking one of the first or second pair of polysilicon projections while conductively doping the other of the first or second pair of polysilicon projections with an n-type or a p-type conductivity enhancing dopant impurity, respectively; the masked doping being conducted to a second impurity concentration which is greater that the first impurity concentration;

out-diffusing n-type conductivity enhancing dopant impurity from the first pair of polysilicon projections into the semiconductor substrate to provide NMOS type diffusion regions within the substrate adjacent the first gate line; and out-diffusing p-type conductivity enhancing dopant impurity from the second pair of polysilicon projections into the semiconductor substrate to provide PMOS type diffusion regions within the substrate adjacent the second gate line.

In accordance with still another aspect of the invention, a method of forming a field effect transistor comprises the following steps:

providing a gate over a semiconductor substrate;

providing a layer of polysilicon over the substrate, the polysilicon layer defining a pair of polysilicon outward projections extending from the semiconductor substrate adjacent the gate;

conductively doping the pair of polysilicon projections with one of an n-type or a p-type conductivity enhancing dopant impurity; and out-diffusing the one of the n-type conductivity enhancing dopant impurity or the p-type conductivity enhancing dopant impurity from the pair of polysilicon projections into the semiconductor substrate to provide one of NMOS or PMOS type diffusion regions, respectively, within the substrate adjacent the gate line.

More particularly, FIG. 1 illustrates a semiconductor wafer fragment in process indicated generally with reference numeral 10. Such comprises a bulk silicon substrate 12 and a series of field oxide regions 13. Bulk substrate 12 is doped with p-type material to an average dopant concentration of $1\times10^{16}$ ions/cm$^3$. Field oxide regions 13 can be recessed relative to substrate 12 if desired. Areas of the illustrated substrate 12 not covered by field oxide regions 13 constitute active area regions 28. A series of gate lines 14, 16 and 18 are provided over bulk substrate 12. Gate line 14 constitutes a first gate line which is positioned relative to bulk substrate 12 for formation of an NMOS transistor. Gate line 16 constitutes a second gate line which is positioned relative to an n-well region 15 of bulk substrate 12 for formation of a PMOS transistor. Gate line 18 overlies the illustrated field oxide region 13 and, depending upon the circuit design out of the plane of the page upon which FIG. 1 lies, might elsewhere overlie n-doped or p-doped substrate for formation of PMOS or NMOS transistors, respectively.

The illustrated word lines comprise. a gate oxide 25, conductively doped polysilicon region 19, an overlying WSi$_x$ layer 20 and an encapsulating thin oxide layer 21. Dopant masking caps 23 are also provided over the illustrated respective word lines. A preferred material for dopant masking caps 23 is Si$_3$N$_4$. A purpose for such caps will be apparent subsequently. Oxide insulating sidewall spacers 22 are also provided relative to the illustrated gate lines. Prior art constructions typically encapsulate the illustrated word lines entirely with a nitride material. However in accordance with a preferred aspect of this invention, the subject word lines are capped with a nitride material and their associated sidewalls are covered with an oxide material. Use of oxide sidewall spacers, as opposed to nitride sidewall spacers, results in lower digit line capacitance in memory arrays.

Figure 2:
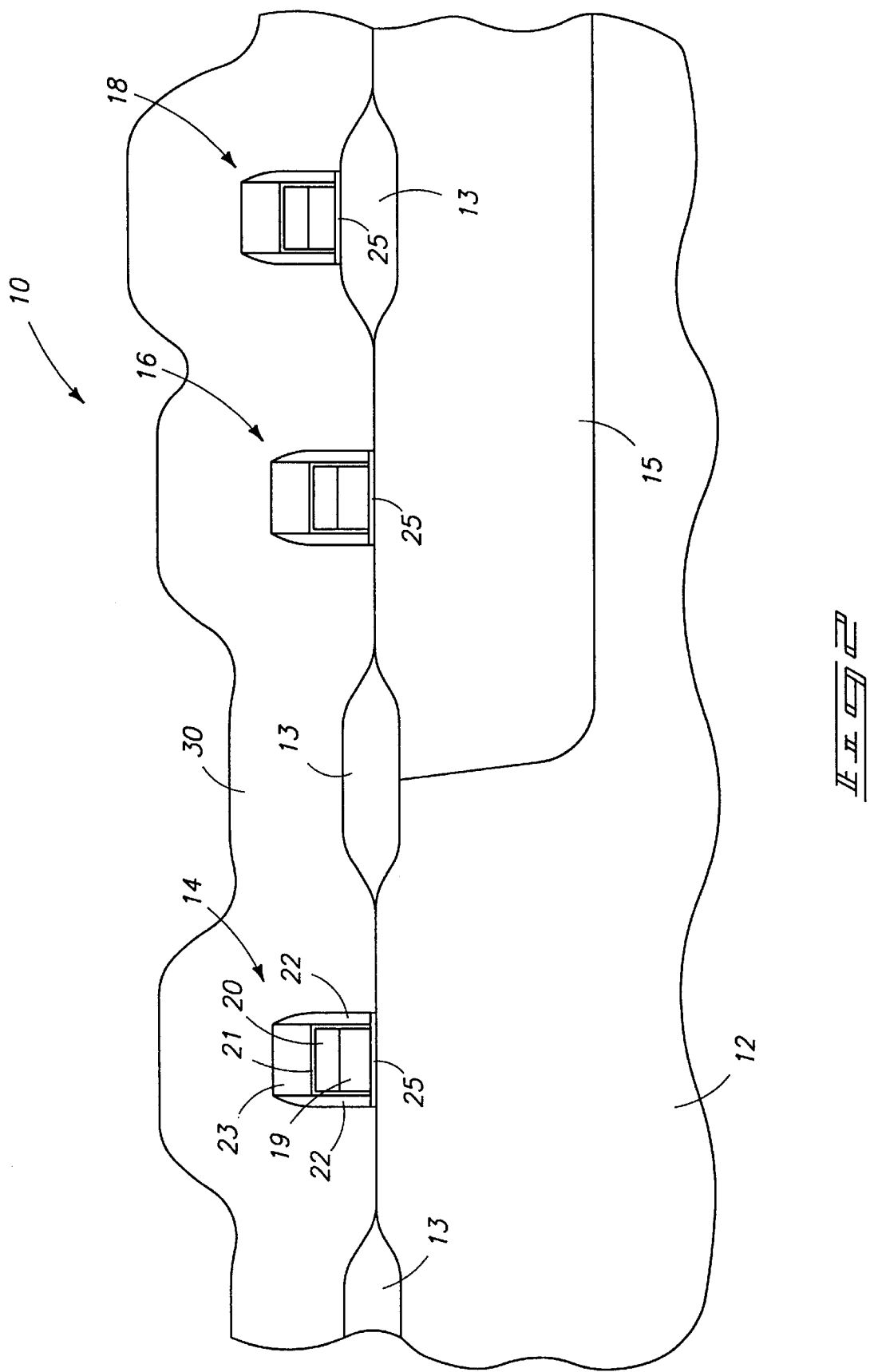
FIG. 2 is a view of the FIG. 1 wafer at a processing step subsequent to that shown by FIG. 1.

Referring to FIG. 2, a layer 30 of polysilicon is deposited over the substrate. Such layer is preferably undoped at this point in the process.

Figure 3:
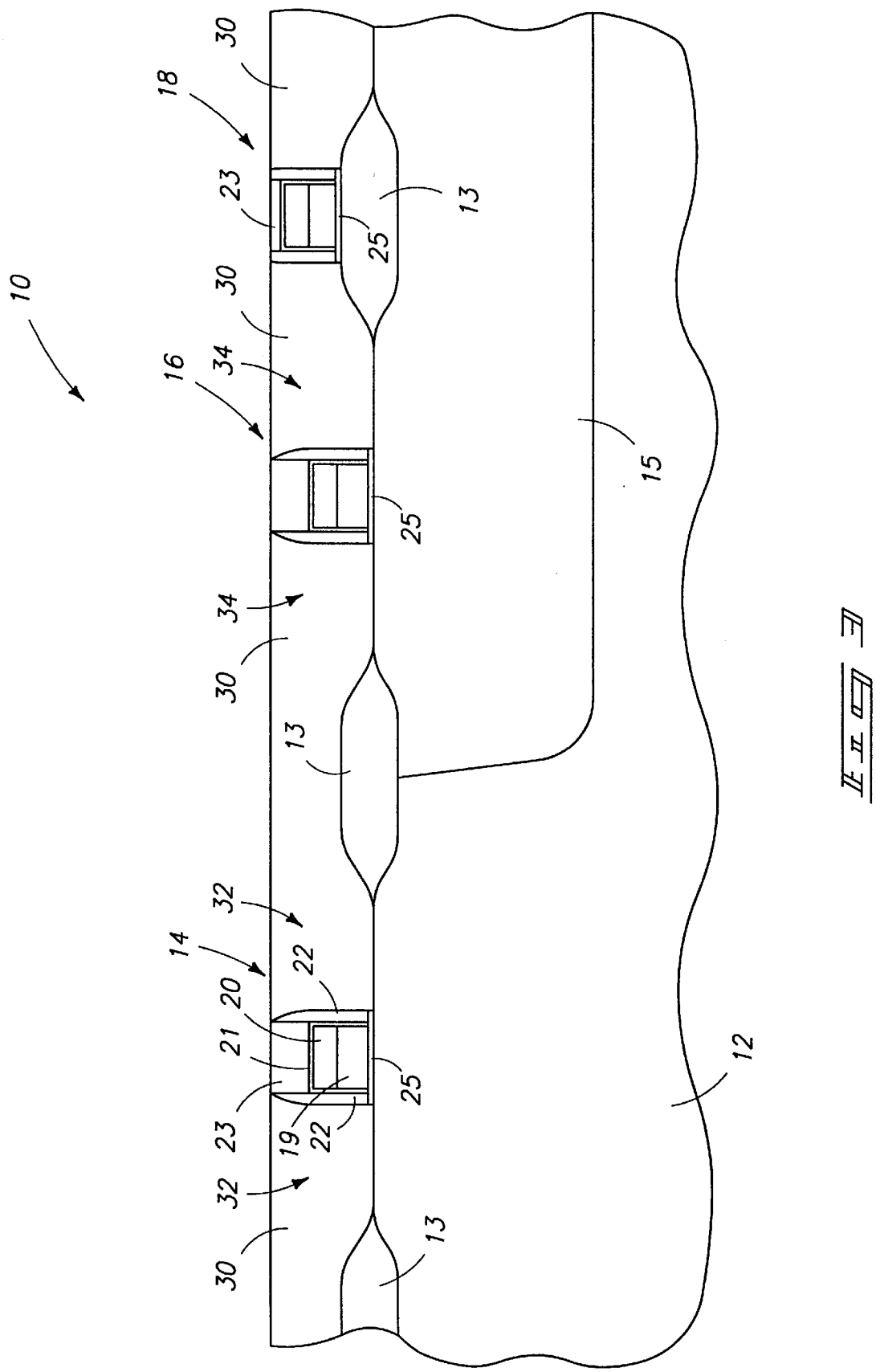
FIG. 3 is a view of the FIG. 1 wafer at a processing step subsequent to that shown by FIG. 2.

Referring to FIG. 3, polysilicon layer 30 is etched back. The preferred technique is by chemical-mechanical polishing utilizing the furthestmost projecting masking cap 23 as a chemical-mechanical polishing etch stop. Subsequently, a substantially non-selective etch back is conducted. An effective insulating portion of nitride capping layer 23 over word line 18 remain after such etching back. Where field oxide regions 13 are provided to be substantially fully recessed, the upper or outermost portions of dopant masking caps 23 would be more coincident (i.e., at the same elevation). In such instance, a single chemical-mechanical polishing step to effect the total etch back is preferred.

Layer 30 defines a first pair 32 of polysilicon outward projections which extend from semiconductor substrate 12 adjacent first gate line 14. Polysilicon layer 30 further defines a second pair 34 of polysilicon outward projections extending from semiconductor well region 15 adjacent second gate line 16.

Figure 4:
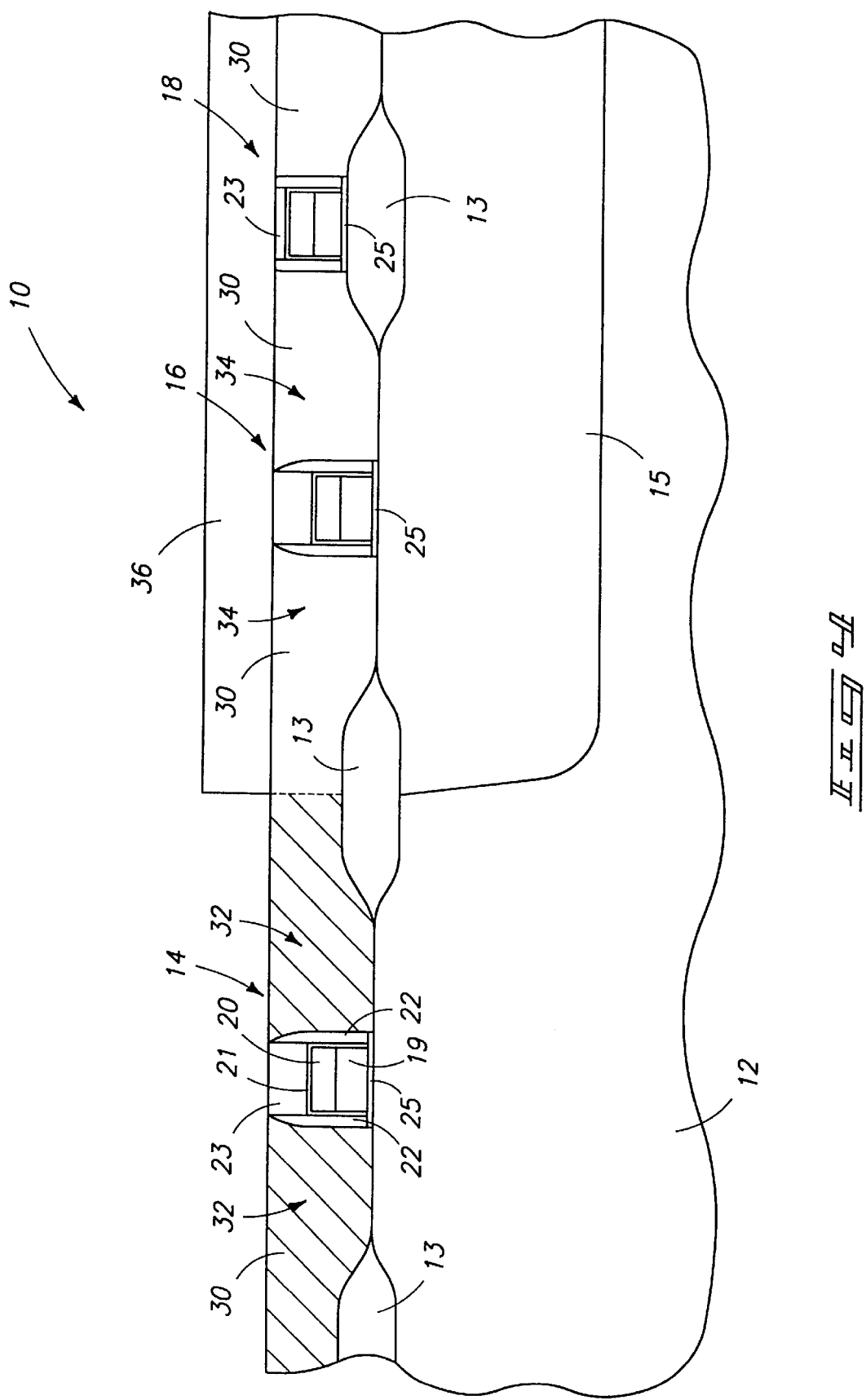
FIG. 4 is a view of the FIG. 1 wafer at a processing step subsequent to that shown by FIG. 3.

Referring to FIG. 4, second pair of polysilicon projections 34 are masked with a masking layer 36 while conductively doping first pair of polysilicon outward projections 32 with an n-type conductivity enhancing dopant impurity, such as phosphorous. A desired peak dopant impurity concentration of projections 32 is at least $1\times10^{20}$ ions/cm$^3$. Such doped plugged regions 32 in FIG. 4 and subsequent figures are illustrated by the left downward angling section lines. During such doping, nitride caps 23 of exposed word lines serve as a dopant implant mask to the implanting n- ions such that word line regions 20 and 19 are not implanted with such material. Example doping conditions include ion implantation at an energy level of 30 KeV and an implant dose of $1\times10^{15}$ ions/cm$^2$.

Figure 5:
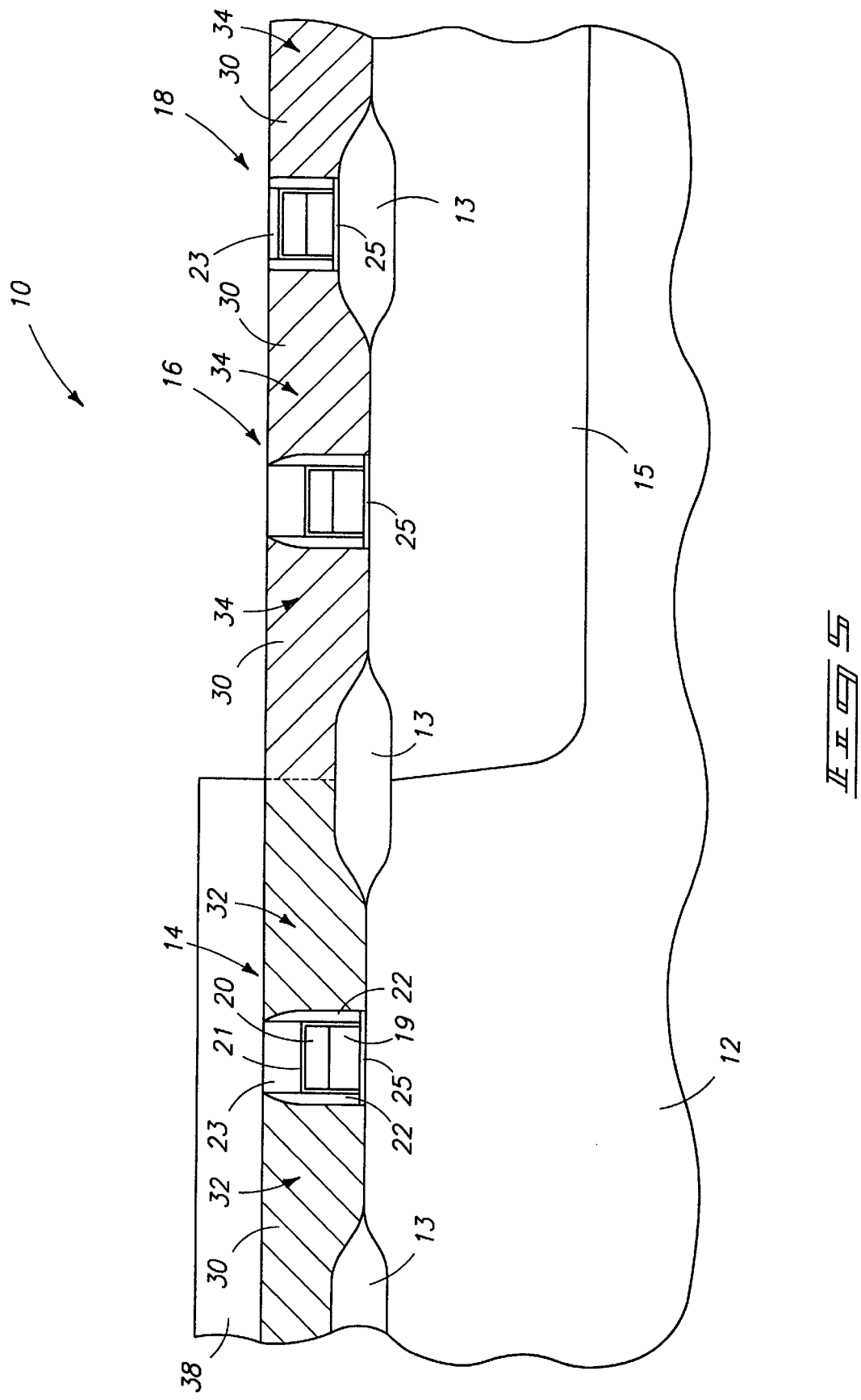
FIG. 5 is a view of the FIG. 1 wafer at a processing step subsequent to that shown by FIG. 4.
Figure 6:
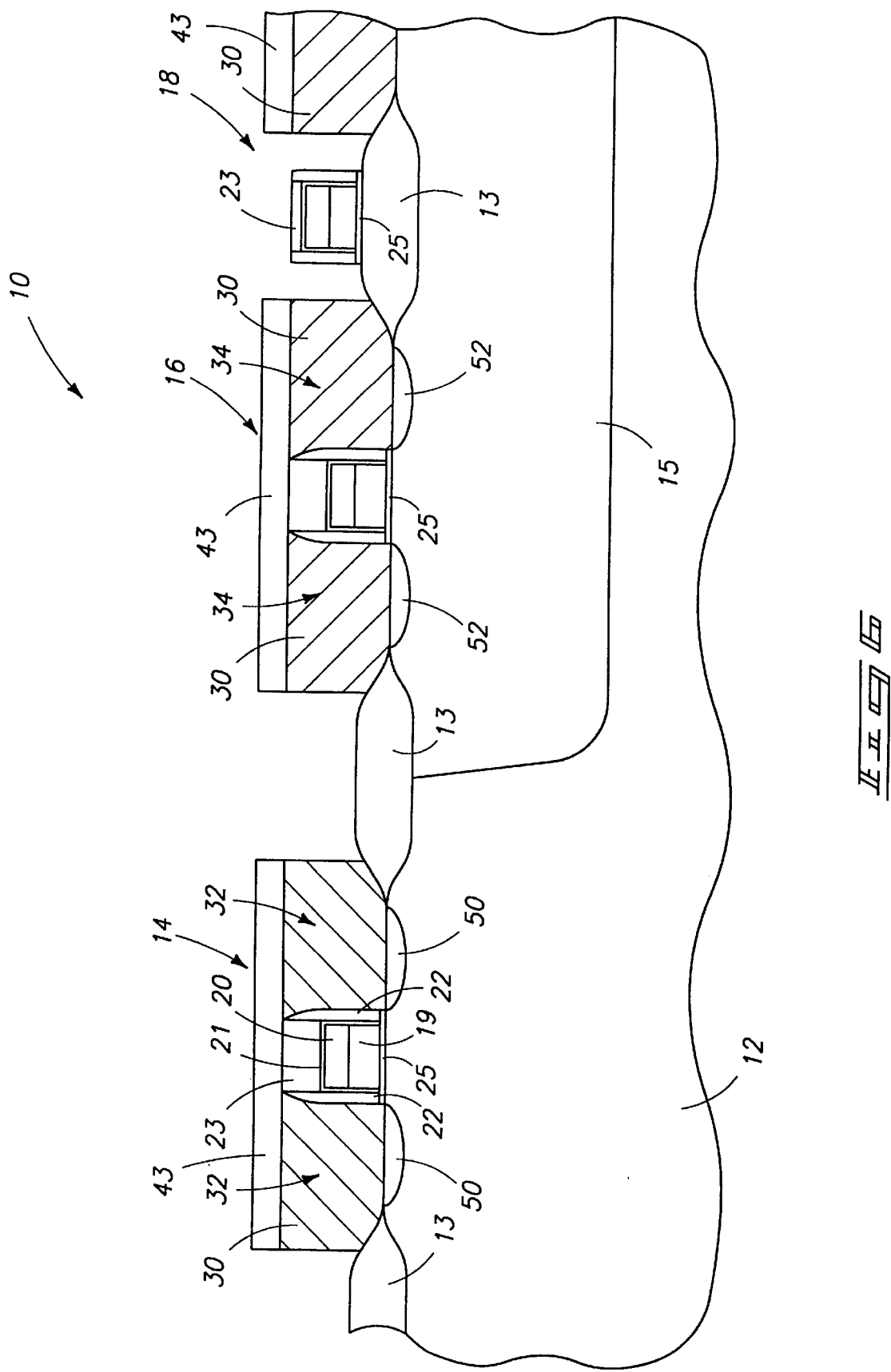
FIG. 6 is a view of the FIG. 1 wafer at a processing step subsequent to that shown by FIG. 5.

Referring to FIG. 5, first pair of polysilicon projections 32 are masked with a masking layer 38 while second pair of polysilicon projections 34 are conductively doped with a p-type conductivity doping enhancing dopant impurity, such as boron. Such doped plugged regions 34 in FIGS. 5 and 6 are illustrated by the right downward angling section lines. The desired peak dopant impurity concentration within second pair of polysilicon plugs 34 is again at least $1\times10^{20}$ ions/cm$^3$. The preferred deposition technique is again by ion implantation, at an energy level of 30 KeV and an implant dose of $1\times10^{15}$ ions/cm$^2$. During such implanting, cap 23 over word line 16 masks the conductive regions of word line 16 from being doped with p-material.

Referring to FIG. 6, a photoresist masking layer 43 is provided and exposed portions of polysilicon layer 30 are etched to isolate first and second pairs 32 and 34 of the polysilicon outward projections from one another.

Figure 7:
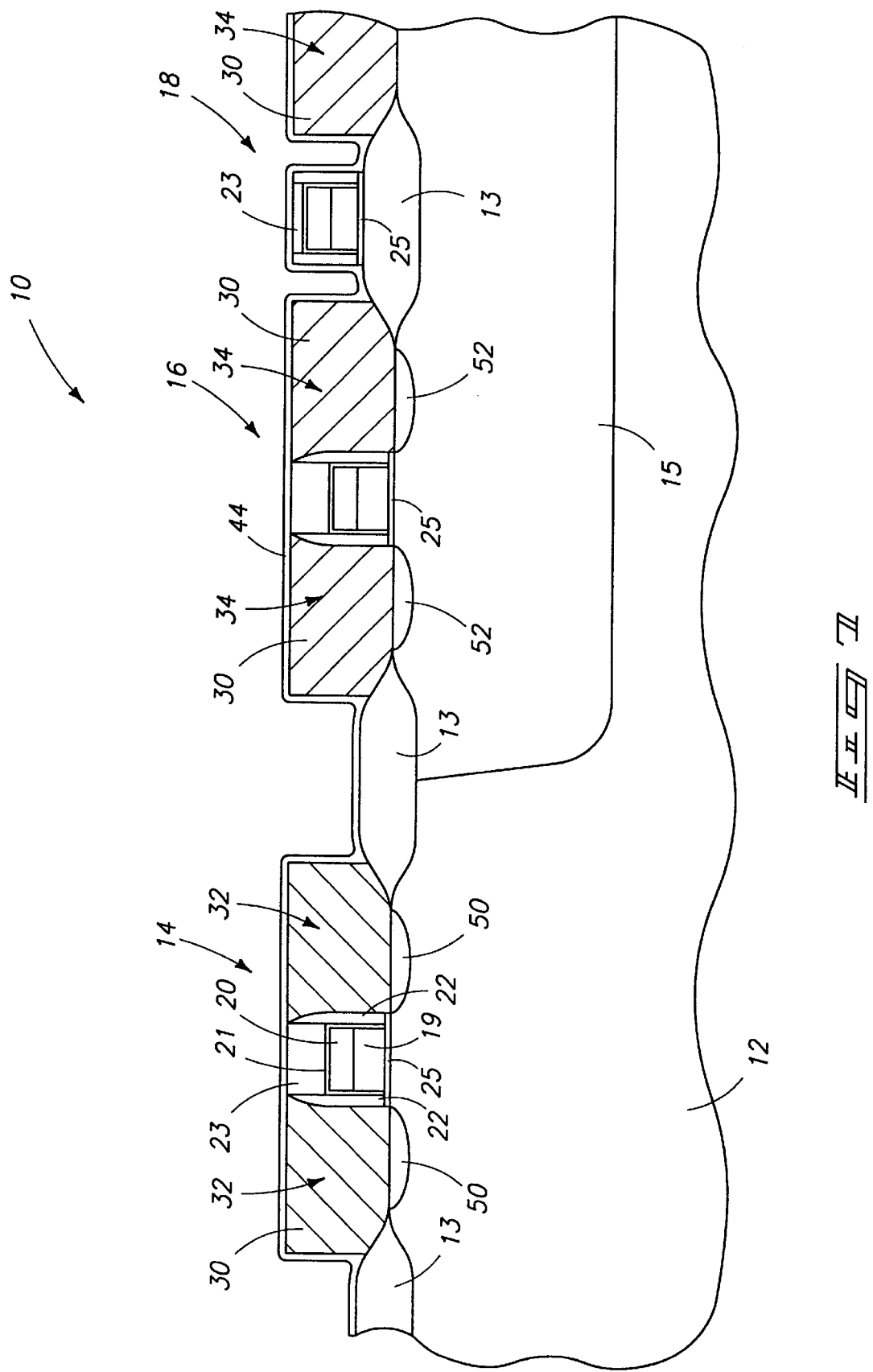
FIG. 7 is a view of the FIG. 1 wafer at a processing step subsequent to that shown by FIG. 6.
Figure 8:
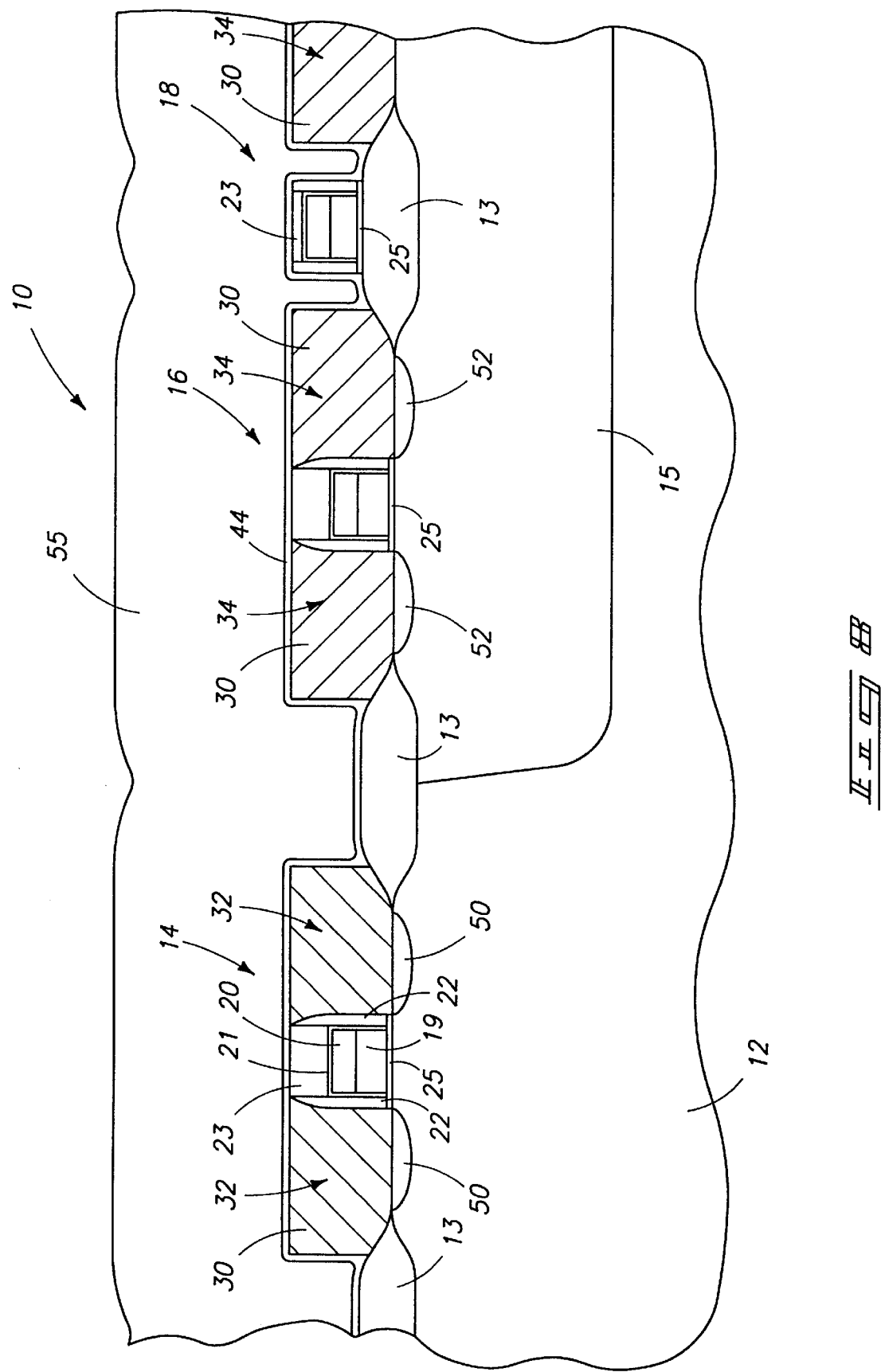
FIG. 8 is a view of the FIG. 1 wafer at a processing step subsequent to that shown by FIG. 7.

Referring to FIG. 7, an outgassing capping layer 44 is provided over first and second pairs 32 and 34 of polysilicon outward projections, respectively. Such layer preferably constitutes a 100 Angstroms to 200 Angstroms thick layer of $Si_3N_4$. Wafer 10 is thereafter subjected to high temperature annealing conditions to cause out-diffusing of n-type conductivity enhancing dopant impurity from first pair of polysilicon projections 32 into semiconductor substrate 12, and out-diffusion of p-type conductivity dopant impurity from second pair of polysilicon projections 34 into n-well 15 of semiconductor substrate 12. The result is provision of a pair of NMOS type diffusion regions 50 within S substrate 12 adjacent first gate line 14, and provision of a pair of PMOS type diffusion regions 52 within n-well 15 portion of substrate 12 adjacent second gate line 16. Such out-diffusions are preferably conducted simultaneously, with example annealing conditions to produce such being exposure of the wafer to 900° C. for 15 minutes. Such exposure provides the combined effect of driving dopant atoms from the respective polysilicon projections into the substrate, as well as activating the implanted dopants within the substrate. Most preferably and typically, inherent subsequent wafer processing beyond that illustrated by FIG. 6 will subject the wafer to effective temperatures for suitable times to produce such driving and annealing effects. During such steps, outer nitride layer 44 prevents outgassing of dopant impurity upwardly from the outward polysilicon projections. An insulating dielectric layer 55 is subsequently provided (FIG. 8.).

The above described preferred process provides advantages, such as only one polysilicon deposition and one CMP step for NMOS and PMOS transistor plug formation. Thus, mask count is reduced. Such further enables production of shallow source/drain diffusion regions within the bulk substrate, if desired. An additional advantage, is a fast poly deposition rate for layer 30, where no in situ doping is utilized. Further, a self-aligned etch for producing contacts to the active area diffusion region is not needed, and correspondingly no etch stop layer for such typical prior art etching is utilized. This facilitates or enables the use of word line sidewall spacers made of oxide as opposed to nitride for lowering digit line capacitance. Further, elimination of prior art deep n+ and p+ contacts is enabled. The above process also a enables an advantage of eliminating metal to bulk silicon contacts for diffusion regions. Such further provides improved packing density without necessitating n+/p+ surround of contacts.

Figure 9:
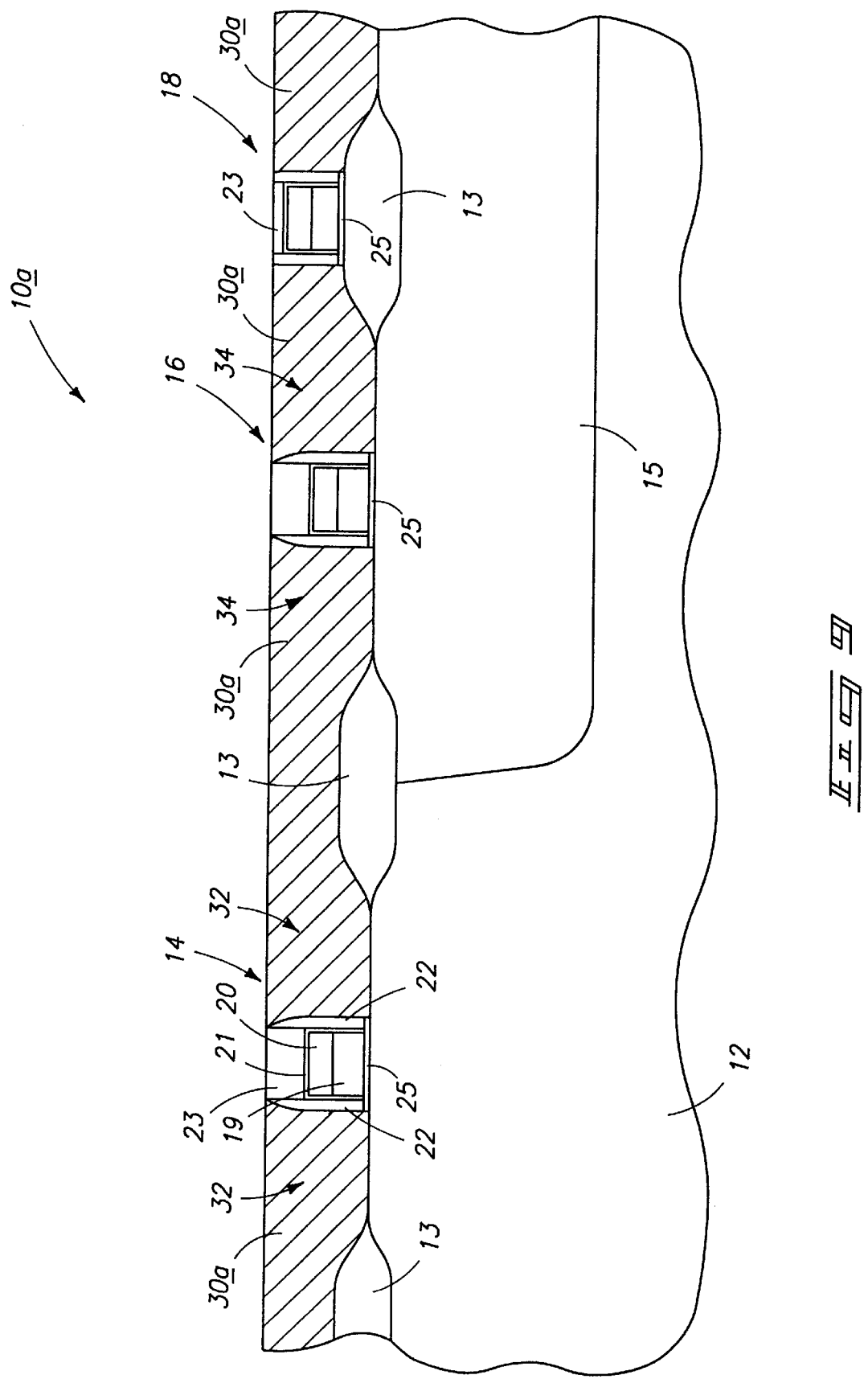
FIG. 9 is a diagrammatic sectional view of an alternate embodiment semiconductor wafer fragment at an alternate processing step in accordance with the invention.

FIGS. 9 and 10 illustrate an alternate embodiment wafer fragment 10a at an alternate processing step in accordance with the invention. Like numerals from the first described embodiment are utilized where appropriate, with differences being indicated with the suffix "a". In FIG. 9, the polysilicon layer 30a of the wafer fragment of FIG. 3 has been blanket doped with p-type material to a first impurity concentration, such as $1 \times 10^{20}$ ions/cm$^3$.

Referring to FIG. 10, masking layer 36 is provided and the unmasked portions of layer 30a are doped with n-type material to a second impurity concentration, with the second impurity concentration being greater than the first. An example second concentration for this example would be $2 \times 10^{20}$ ions/cm . The second concentration is greater than the first such that the material of the second concentration over-compensates for that of the first. Accordingly, subsequent annealing will cause overwhelming out-diffusion of the material of the second concentration such that n-type regions are produced in the substrate. To achieve such, the second concentration is preferably at least twice the first concentration, with the first concentration being at least $1 \times 10^{19}$ ions/cm$^3$ to facilitate adequate concentration in the resultant p-type diffusion regions in n-well 15. The order of p-type or n-type dopings could of course be reversed, with the order of blanket vs. masked doping being reversed as well. The orders shown and described are preferred.

Subsequent layers would be deposited and patterned relative to both described embodiments to provide associated capacitors with respect to one of the diffusion regions of each transistor, with bit line connections to the other diffusion regions of the respective transistors in memory array fabrication. The above described processes have their greatest advantages in the formation of CMOS circuitry. However, the artisan will appreciate that aspects of the invention would also be applicable to formation of only one of NMOS or PMOS type field effect transistors.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a field effect transistor comprising the following steps:

providing a gate over a semiconductor substrate;

providing a laver of polysilicon over the substrate, the polysilicon layer defining a pair of polysilicon outward projections extending from the semiconductor substrate adjacent the gate;

providing a dopant masking cap over the gate;

while the dopant masking cap is over the gate, conductively doping the pair of polysilicon projections with one of an n-type or a p-type conductivity enhancing dopant impurity;

providing an outgassing capping layer over the pair of polysilicon; and after providing the outgassing capping layer, out-diffusing the one of the n-type conductivity enhancing dopant impurity or the p-type conductivity enhancing dopant impurity from the pair of polysilicon projections into the semiconductor substrate to provide one of NMOS or PMOS type diffusion regions, respectively. within the substrate adjacent the gate line.

2. A method of forming a field effect transistor comprising the following steps:

providing a gate over a semiconductor substrate;

providing a nitride dopant masking cap over the gate;

providing oxide insulating sidewall spacers relative to the gate;

providing a layer of polysilicon over the substrate, the polysilicon layer defining a pair of polysilicon outward projections extending from the semiconductor substrate adjacent the gate;

while the nitride dopant masking cap is over the gate. conductivelv doping the pair of polysilicon projections with one of an n-type or a p-type conductivity enhancing dopant impurity; and out-diffusing the one of the n-type conductivity enhancing dopant impurity or the p-type conductivity enhancing dopant impurity from the pair of polysilicon projections into the semiconductor substrate to provide one of NMOS or PMOS type diffusion regions, respectively, within the substrate adjacent the gate line.

3. A method of forming a field effect transistor comprising the following steps:

provviding a gate over a semiconductor substrate;

providing a nitride dopant masking cap over the gate;

providing a layer of polysilicon over the substrate, the polysilicon layer defining a pair of polysilicon outward projections extending from the semiconductor substrate adjacent the gate;

while the nitride dopant masking cap is over the gate, conductively doping the pair of polvsilicon projections with one of an n-type or a p-type conductivity enhancing dopant impurity; and providing an outgassing capping layer over the pair of polysilicon outward projections;

providing oxide insulating sidewall spacers relative to the gate;

while the outgassing capping layer is over the pair of polysilicon outward projections, out-diffusing the one of the n-type conductivity enhancing dopant impurity or the p-type conductivity enhancing dopant impurity from the pair of polysilicon projections into the semiconductor substrate to provide one of NMOS or PMOS type diffusion regions, respectively within the substrate adjacent the gate line.

4. A method of forming a field effect transistor, comprising:

providing a gate structure over a semiconductor substrate, the gate structure comprising a conductively-doped polysilicon region and a dopant masking cap over the conductively-doped polysilicon region;

providing a layer of polysilicon over the substrate and over the dopant masking cap of the gate structure, the polysilicon layer defining a pair of polysilicon outward projections extending from the semiconductor substrate adjacent the gate structure;

removing the layer of polysilicon from over the dopant masking cap;

while the dopant masking cap is over the polysilicon region, conductively doping the pair of polysilicon projections with one of an n-type or a p-type conductivity enhancing dopant impurity; and out-diffusing the one of the n-type conductivity enhancing dopant impurity or the p-type conductivity enhancing dopant impurity from the pair of polysilicon projections into the semiconductor substrate to provide one of NMOS or PMOS type diffusion regions, respectively, within the substrate adjacent the gate line.

5. The method of claim 4 wherein the removing the layer of polysilicon from over the dopant masking cap comprises chemical-mechanical polishing utilizing the dopant masking cap as an etch stop.

6. The method of claim 4 wherein the removing the layer of polysilicon from over the dopant masking cap comprises chemical-mechanical polishing utilizing the dopant masking cap as an etch stop, and wherein the dopant masking cap comprises silicon nitride.

7. The method of claim 4 wherein the dopant masking cap comprises silicon nitride.

8. The method of forming a field effect transistor of claim 4 further comprising providing an outgassing capping layer over the pair of polysilicon outward projections prior to the out-diffusing step.

9. The method of claim 4 wherein the gate structure further comprises a silicide layer over the doped polysilicon region, and an encapsulating oxide layer over the silicide layer, the encapsulating oxide layer being beneath the dopant masking cap.

* * * * *

UNITED STATES PATENT AND TRADEMARK OFFICE
CERTIFICATE OF CORRECTION

PATENT NO. : 5,773,358
DATED : June 30, 1998
INVENTOR(S) : Jeff Zhiqiang Wu et al.

It is certified that error appears in the above-identified patent and that said Letters Patent is hereby corrected as shown below:

| | |
|---|---|
| Col. 2, l. 39: | Delete "is". |
| Col. 5, l. 14: | After "within" delete "S". |
| Col. 5, l. 46: | After "also" delete "a". |
| Col. 6, l. 33: | Replace "laver" with --layer--. |
| Col. 6, l. 43: | After "polysilicon" insert --outward projections--. |
| Col. 6, l. 49: | Replace the "." with --,--. |

Signed and Sealed this

Twenty-second Day of September, 1998

Attest:

BRUCE LEHMAN

*Attesting Officer*  *Commissioner of Patents and Trademarks*